(12) United States Patent
Cheng et al.

(10) Patent No.: US 11,651,985 B2
(45) Date of Patent: May 16, 2023

(54) ALIGNMENT SYSTEM AND ALIGNMENT MARK

(71) Applicant: UNITED MICROELECTRONICS CORP., Hsin-Chu (TW)

(72) Inventors: Yu-Wei Cheng, Kaohsiung (TW); Chien-Hao Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 298 days.

(21) Appl. No.: 17/135,911

(22) Filed: Dec. 28, 2020

(65) Prior Publication Data
US 2022/0122869 A1    Apr. 21, 2022

(30) Foreign Application Priority Data
Oct. 19, 2020   (CN) ........................... 202011116436.9

(51) Int. Cl.
*H01L 21/68* (2006.01)
*H01L 23/544* (2006.01)

(52) U.S. Cl.
CPC .......... *H01L 21/682* (2013.01); *H01L 23/544* (2013.01); *H01L 2223/54426* (2013.01)

(58) Field of Classification Search
CPC .................... H01L 23/544; H01L 2223/54426
USPC ....................................................... 356/400
See application file for complete search history.

(56) References Cited

U.S. PATENT DOCUMENTS

| | | | |
|---|---|---|---|
| 5,734,478 A * | 3/1998 | Magome ............... | G03F 9/7049 250/548 |
| 8,072,615 B2 | 12/2011 | Musa | |
| 8,208,121 B2 | 6/2012 | Bijnen | |
| 2013/0059240 A1 * | 3/2013 | Van Der Schaar ......................... | G03F 7/70633 430/30 |

* cited by examiner

*Primary Examiner* — Tarifur R Chowdhury
*Assistant Examiner* — Omar H Nixon
(74) *Attorney, Agent, or Firm* — Winston Hsu (57) ABSTRACT

An alignment system includes a light source for emitting a light. An alignment mark is disposed on a substrate for receiving the light. The alignment mark includes a first pattern and a second pattern disposed on the substrate. The first pattern includes a first region and a second region. The second pattern includes a third region and a fourth region. The first region and the third region are symmetrical with respective to a symmetrical axis. The second region and the fourth region are symmetrical with respective to the symmetrical axis. The first region includes first mark lines parallel to each other. The second region includes second mark lines parallel to each other. A first pitch is disposed between the first mark lines adjacent to each other. A second pitch is disposed between the second mark lines adjacent to each other. The first pitch is different from the second pitch.

20 Claims, 5 Drawing Sheets

ALIGNMENT SYSTEM AND ALIGNMENT MARK

BACKGROUND OF THE INVENTION

1. Field of the Invention

The present invention relates to an alignment mark and an alignment system, and more particularly to an alignment mark with symmetrical patterns and an alignment system using the aforesaid alignment mark.

2. Description of the Prior Art

In the semiconductor manufacturing process, lithography devices are used to form circuit patterns on the wafer. Generally, after a photoresist is formed on the wafer, light is applied to the circuit pattern on the photomask to transfer the circuit pattern onto the photoresist on the wafer. Currently, the lithography devices include a stepper, which projects light to the entire circuit pattern at one shop to transfer the circuit pattern on the wafer at each exposure step.

The Lithography devices also include a scanner. The scanner moves the photomask and the wafer synchronously during each exposure step, and allows exposure light to illuminate part of the circuit pattern at each exposure step to transfer the circuit pattern onto the wafer. In order to accurately project the circuit pattern on the desired position on the wafer, the wafer must be aligned with the exposure device before the exposure. In order to align the wafer, alignment marks are formed on the wafer.

The exposure devices use lasers to detect alignment marks on the wafer and perform image processing to locate the wafer. The exposure device can locate the wafer based on the alignment results. By moving the wafer stage or the photomask to align the wafer and the photomask to correct relative positions to ensure the reliability of the exposure process.

SUMMARY OF THE INVENTION

In light of above, an alignment mark and an alignment system are provided in the present invention to improve the accuracy of the alignment.

According to a preferred embodiment of the present invention, an alignment system includes a first light source for emitting a first light. An alignment mark is disposed on a substrate for receiving the first light, wherein the alignment mark includes a first pattern and a second pattern disposed on the substrate, wherein the first pattern includes a first region and a second region, the second pattern includes a third region and a fourth region, a symmetrical axis is disposed at an interface between the first region and the second region, the first region and the third region are symmetrical with respective to the symmetrical axis, and the second region and the fourth region are symmetrical with respective to the symmetrical axis. The first region includes numerous first mark lines parallel to each other, a first pitch is disposed between the first mark lines adjacent to each other, the second region includes numerous second mark lines parallel to each other, a second pitch is disposed between the second mark lines adjacent to each other. The first pitch is different from the second pitch. A sensor is used for detecting a first diffracted light diffracted from the alignment mark radiated by the first light.

According to another preferred embodiment of the present invention, an alignment system includes a first light source for emitting a first light. An alignment mark disposed on a substrate for receiving the first light, wherein the alignment mark includes a first pattern and a second pattern disposed on the substrate, wherein the first pattern includes a first region and a second region, the second pattern includes a third region and a fourth region, a symmetrical axis is disposed at an interface between the first region and the second region, the first region and the third region are symmetrical with respective to the symmetrical axis, and the second region and the fourth region are symmetrical with respective to the symmetrical axis. The first region includes numerous first mark lines parallel to each other, each of the first mark lines extends along a first direction, a first angle is disposed between the first direction and the symmetrical axis, the second region includes numerous second mark lines parallel to each other, each of the second mark lines extends along a second direction, a second angle is disposed between the second direction and the symmetrical axis, the first angle is different from the second angle. A sensor is used for detecting a first diffracted light diffracted from the alignment mark radiated by the first light.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
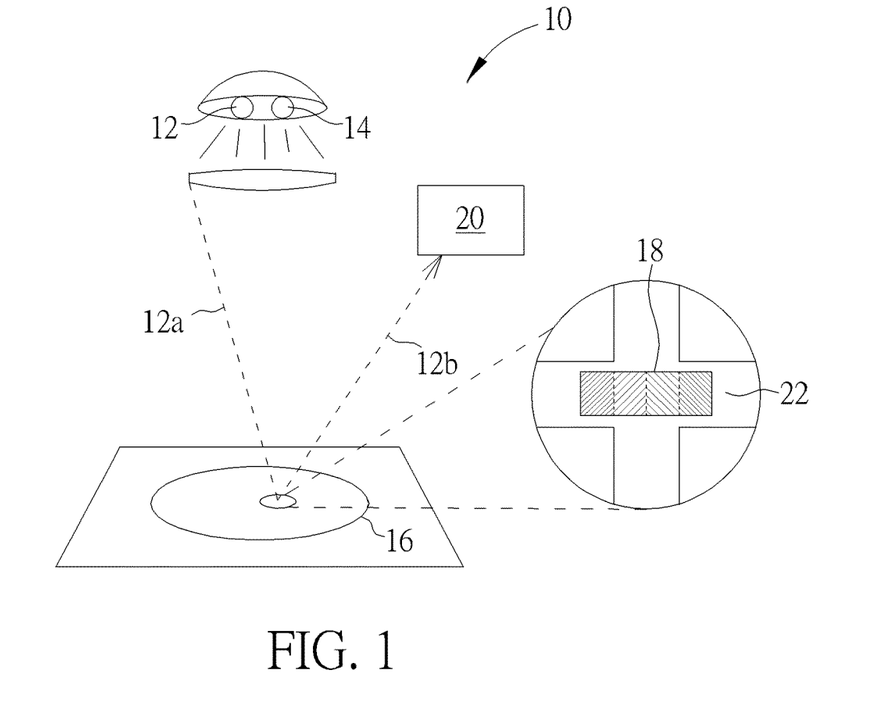
FIG. 1 depicts an alignment system according to a preferred embodiment of the present invention.

FIG. 1 depicts an alignment system according to a preferred embodiment of the present invention. As shown in FIG. 1, an alignment system 10 includes a first light source 12 and a second light source 14. The first light source is for emitting a first light 12a. A second light source 14 is used for emitting a second light (not shown). An alignment mark 18 is disposed on the substrate 16. The alignment mark 18 is used to receive the first light 12a and the second light. A sensor 20 is used for detecting a first diffracted light 12b diffracted from the alignment mark 18 radiated by the first light 12, and a second diffracted light from the alignment mark 18 radiated by the second light. The alignment mark 18 is preferably disposed on the scribe line 22 of the substrate 16. The number and the position of the alignment mark 18 on the wafer 10 can be adjusted based on different requirements, and not limited to the number and the position shown in FIG. 1. The alignment system 10 includes numerous light sources with different wave lengths such as red light, blue light, green light and far red light. Based on different processes, different light sources illuminate the alignment mark 18 in turns. Because the illuminating route of the second light and the first light 12a are the same, only the illuminating sequences are different; please refer to the first light 12a and the first diffracted light 12b for the routes of the second light and the second diffracted light.

Figure 2:
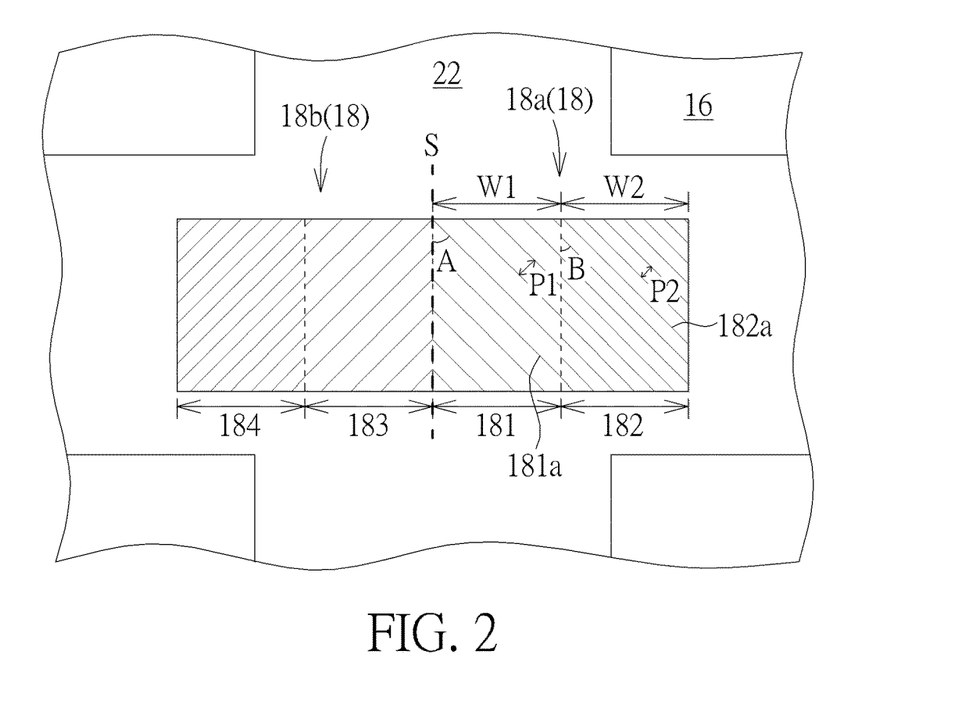
FIG. 2 depicts an alignment mark of an alignment system of the present invention.

FIG. 2 depicts an alignment mark of an alignment system of the present invention, wherein like reference numerals are used to refer to like elements throughout. As shown in FIG. 2, an alignment mark 18 includes a first pattern 18a and a second pattern 18b disposed on the substrate 16. The first pattern 18a and the second pattern 18b are symmetrical. A symmetrical axis S is marked by dotted lines at an interface between the first pattern 18a and the second pattern 18b. However the symmetrical axis S does not actually located on the alignment mark 18, the symmetrical axis S is only shown for describing the embodiment clearly. The first pattern 18a and the second pattern 18b are symmetrical with respective to the symmetrical axis S. The first pattern 18a may include several regions such as a first region 181 and a second region 182. The second pattern 18b may include several regions such as a third region 183 and a fourth region 184. The second region 182, the first region 181, the third region 183 and the fourth region 184 are lined up in a sequence of the second region 182, the first region 181, the third region 183 and the fourth region 184. The symmetrical axis S is set at the interface between the first region 181 and the third region 183 so that the first region 181 and the third region 183 are symmetrical with respective to the symmetrical axis S, and the second region 182 and the fourth region 184 are symmetrical with respective to the symmetrical axis S. Dotted lines are marked between the first region 181, the second region 182, the third region 183 and the fourth region 184, however, the dotted lines are not actually shown on the alignment mark 18. Because the first pattern 18a and the second pattern 18b are symmetrical, only the designing rules of the first region 181 and the second region 182 of the first pattern 18a are described in the following description.

The first region 181 includes numerous first mark lines 181a parallel to each other. A first pitch P1 is disposed between the first mark lines 181a adjacent to each other. Each of the first mark lines 181a extends along a first direction. A first angle A is disposed between the first direction and the symmetrical axis S. The second region 182 includes numerous second mark lines 182a parallel to each other. A second pitch P2 is disposed between the second mark lines 182a adjacent to each other. Each of the second mark lines 182a extends along a second direction. A second angle B is disposed between the second direction and the symmetrical axis S. Besides, the first region 181 includes a first width W1. The first width W1 is perpendicular to the symmetrical axis S. The second region 182 includes a second width W2. The second width W2 is perpendicular to the symmetrical axis S. The first mark lines 181a and the second mark lines 182a may be material layers protruding from the substrate 16 or embedded within the substrate 16. The first mark lines 181a and the second mark lines 182a can be formed by metals, insulating materials, alloys, or metal compounds. For example, Cu, W, $SiO_2$, $Si_3N_4$ or WN can be used as materials for the first mark lines 181a and the second mark lines 182a. For instance, the first mark lines 181a and the second mark lines 182a can be metal layers embedded within the substrate 16. Furthermore, a width of each of the first mark lines 181a are the same. A width of each of the second mark lines 182a are the same as well. The width of the first mark line 181a and the width of the second mark line 182a are also the same. Please refer to FIG. 10 for positions of the width D1 of one of the first mark line 181a and the width D2 of one of the second mark line 182a.

In the following description, a first angle A is the same as the second angle B or different from the second angle B means that degree of first angle A and degree of the second angle B are compared to show the similarity or difference. A first width W1 is the same as the second width W2 or different from the second width W2 means that a value of the first width W1 and a value of the second width W2 are compared to show the similarity or difference. A first pitch P1 is the same as the second pitch P2 or different from the second pitch P2 means that a value of the first pitch P1 and a value of the second pitch P2 are compared to show the similarity or difference.

The designing rules of the alignment mark 18 should at least obey one of the rules listed as follows. The designing rules include: (1) The first pitch P1 is different from the second pitch P2. (2) The first angle A is different from the second angle B. (3) The first pitch P1 is different from the second pitch P2, and the first angle A is different from the second angle B. When following the designing rules, the first width W1 can be the same as or different from the second width W2. According to a preferred embodiment of the present invention, the first angle A is between 30 and 60 degrees. The second angle B is between 30 and 60 degrees. The first pitch P1 is between 0.6 and 1.8 µm. The second pitch P2 is between 0.6 and 1.8 µm.

After permutations and combinations of the designing rules, there are various designing ways of the alignment mark of the present invention. Please refer to FIG. 2. The designing rules used in FIG. 2 follows the rules that the first pitch P1 is different from the second pitch P2 and the first angle A is the same as the second angle B. More specifically speaking, the first pitch P1 is larger than the second pitch P2. As mentioned above, after meeting the designing rules, the first width W1 can be the same as or different from the second width W2. FIG. 2 is exemplified as the first width W1 equaling to the second width W2.

Figure 3:
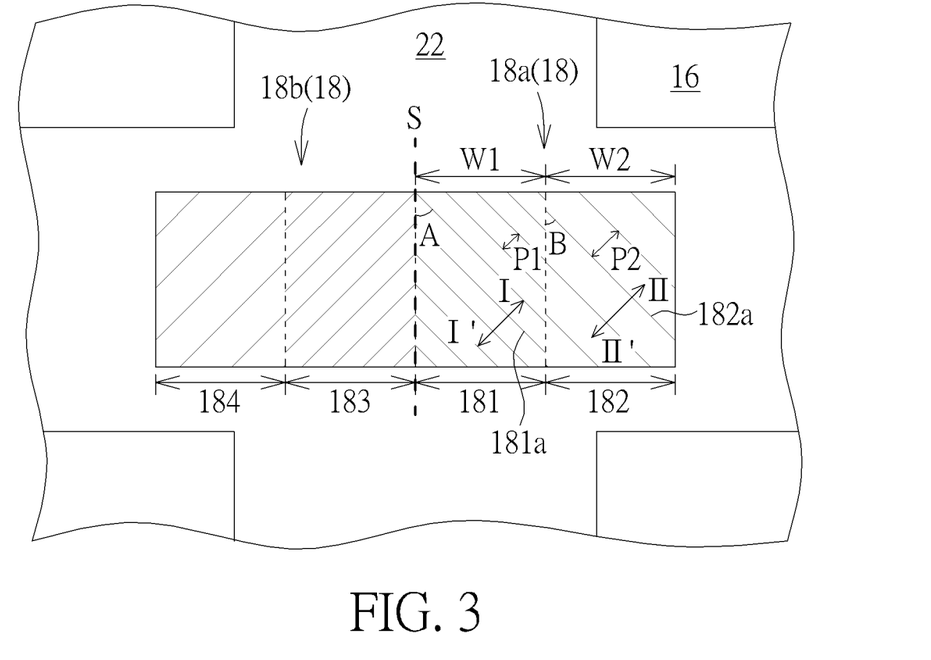
FIG. 3 depicts an alignment mark of an alignment system according another preferred embodiment of the present invention.

FIG. 3 to FIG. 6 depict an alignment mark of an alignment system of the present invention according other embodiments of the present invention, wherein elements in FIG. 3 to FIG. 6 which are substantially the same as those in the embodiment of FIG. 1 to FIG. 2 are denoted by the same reference numerals; an accompanying explanation is therefore omitted. As shown in FIG. 3, the designing rule applied in FIG. 3 is that the first pitch P1 is different from the second pitch P2 and the first angle A is the same as the second angle B. More specifically speaking, the first pitch P1 is smaller than the second pitch P2. After meeting the designing rules, the first width W1 may be the same as or different from the second width W2. FIG. 3 is exemplified as the first width W1 equaling to the second width W2.

Figure 4:
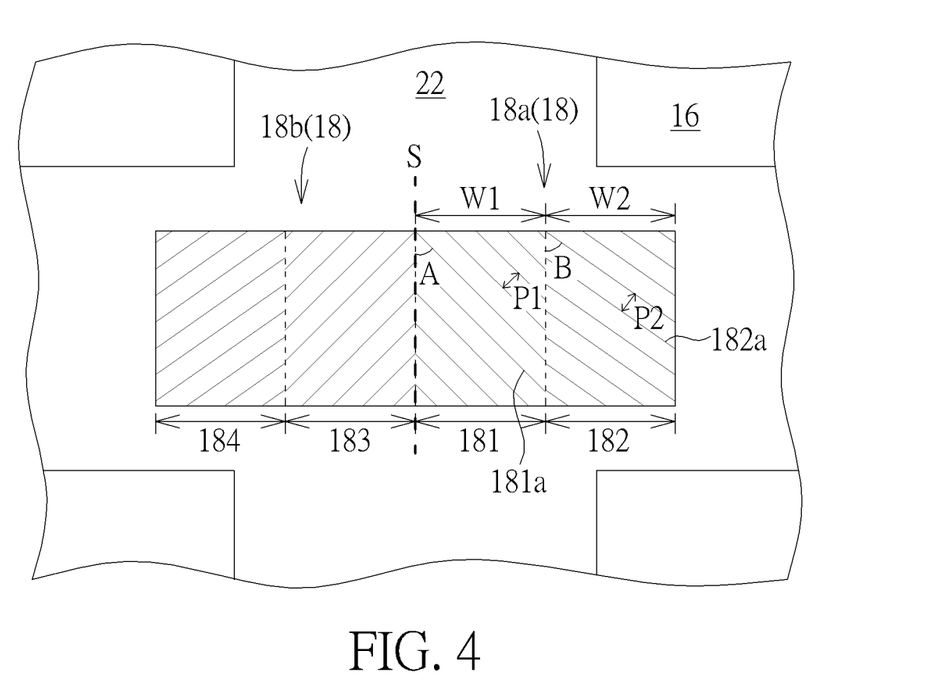
FIG. 4 depicts an alignment mark of an alignment system according another preferred embodiment of the present invention.

As shown in FIG. 4, the designing rule applied in FIG. 4 is that the first pitch P1 is the same as the second pitch P2 and the first angle A is different from the second angle B. More specifically speaking, the first angle A is smaller than the second angle B. After meeting the designing rules, the first width W1 may be the same as or different from the second width W2. FIG. 4 is exemplified as the first width W1 equaling to the second width W2.

Figure 5:
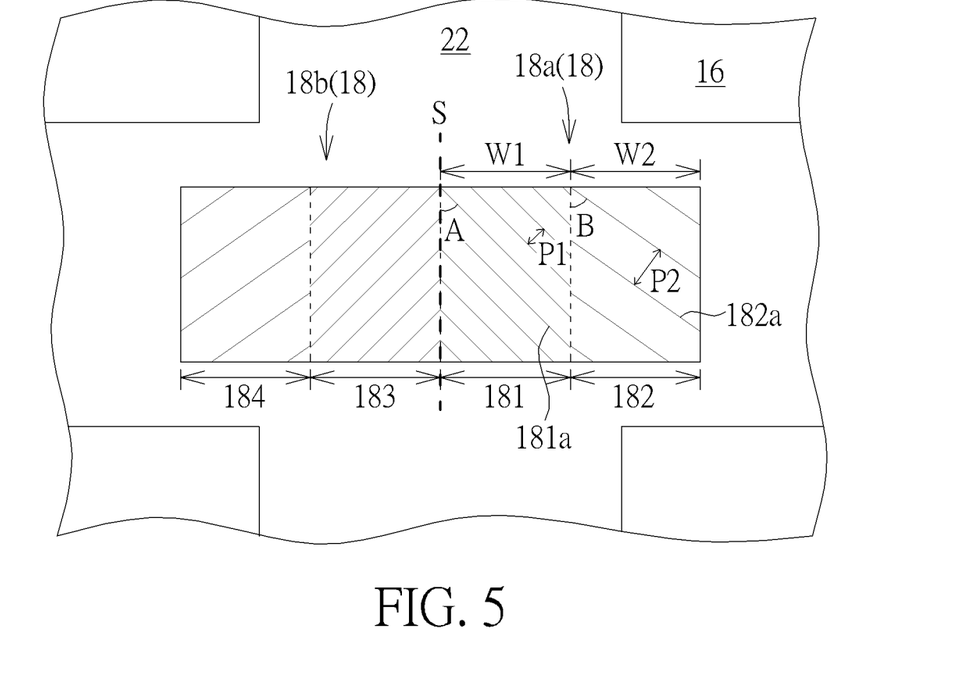
FIG. 5 depicts an alignment mark of an alignment system according another preferred embodiment of the present invention.

As shown in FIG. 5, the designing rule applied in FIG. 5 is that the first pitch P1 is different from the second pitch P2 and the first angle A is also different from the second angle B. More specifically speaking, the first angle A is smaller than the second angle B, and the first pitch A is smaller than the second pitch P2. After meeting the designing rules, the first width W1 may be the same as or different from the second width W2. FIG. 5 is exemplified as the first width W1 equaling to the second width W2.

Figure 6:
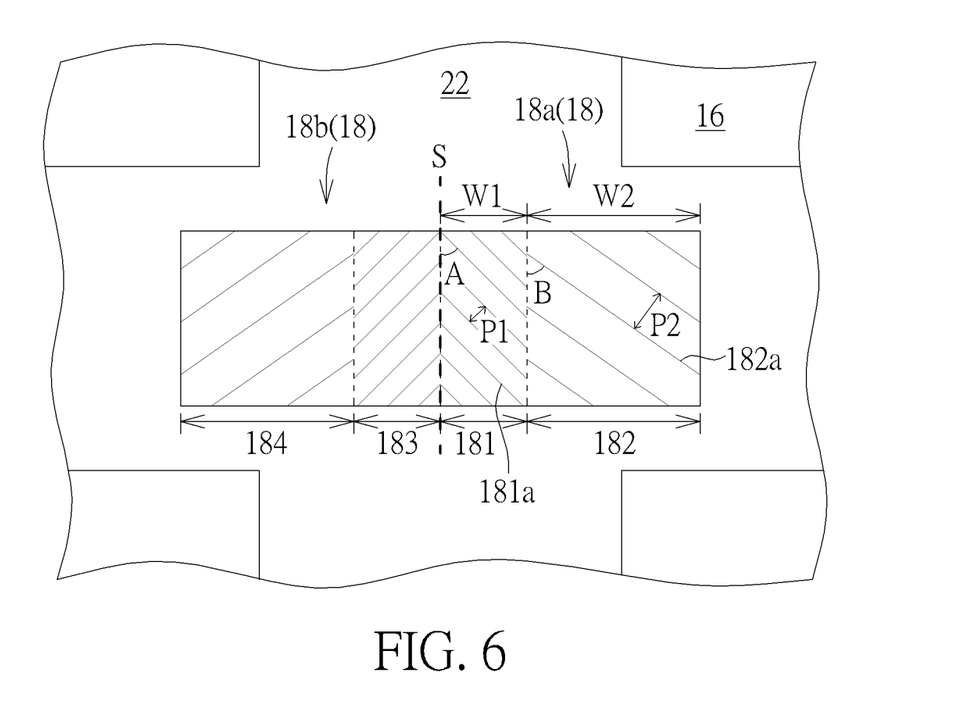
FIG. 6 depicts an alignment mark of an alignment system according another preferred embodiment of the present invention.

As shown in FIG. 6, the designing rule applied in FIG. 6 is that the first pitch P1 is different from the second pitch P2 and the first angle A is different from the second angle B. More specifically speaking, the first angle A is smaller than the second angle B, and the first pitch A is smaller than the second pitch P2. After meeting the designing rules, the first width W1 may be the same as or different from the second width W2. FIG. 6 is exemplified as the first width W1 being smaller than the second width W2.

As mentioned above, the first pattern 18a may include several regions. Although there are only two regions in the first pattern 18a shown in FIG. 2 to FIG. 6 as an example, the first pattern 18a can include more than two regions. Because there is symmetry between the first pattern 18a and the second pattern 18b, when there are more than two regions within the first pattern 18a, there are also more than two regions within the second pattern 18b. The following illustration will be described by showing three regions within the first patterns 18a as an example. However, based on different process requirements, the regions in the first pattern 18a can be altered.

Figure 7:
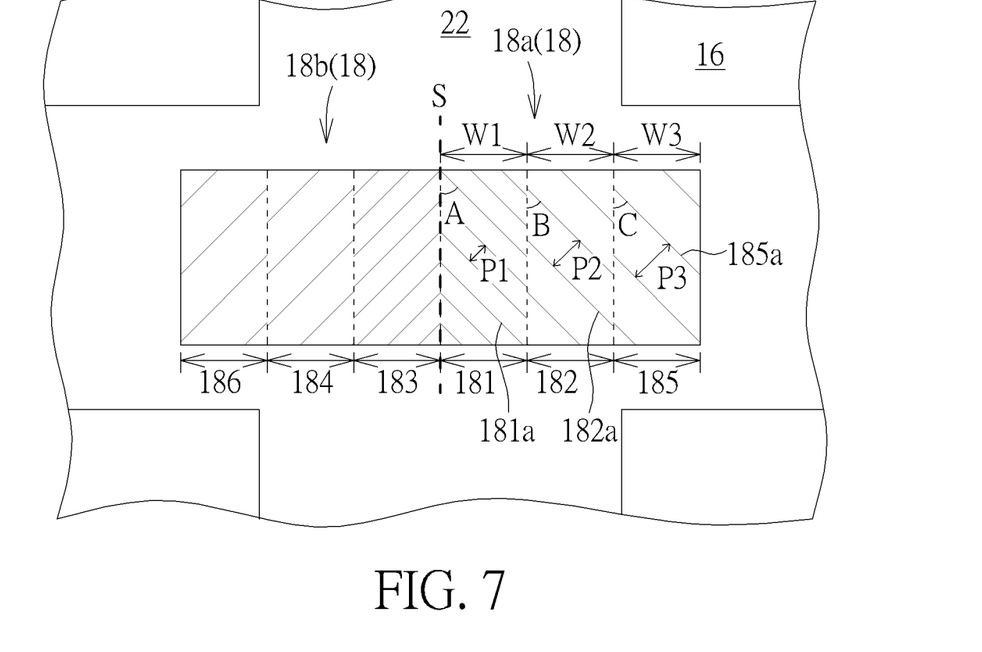
FIG. 7 depicts an alignment mark of an alignment system according another preferred embodiment of the present invention.
Figure 8:
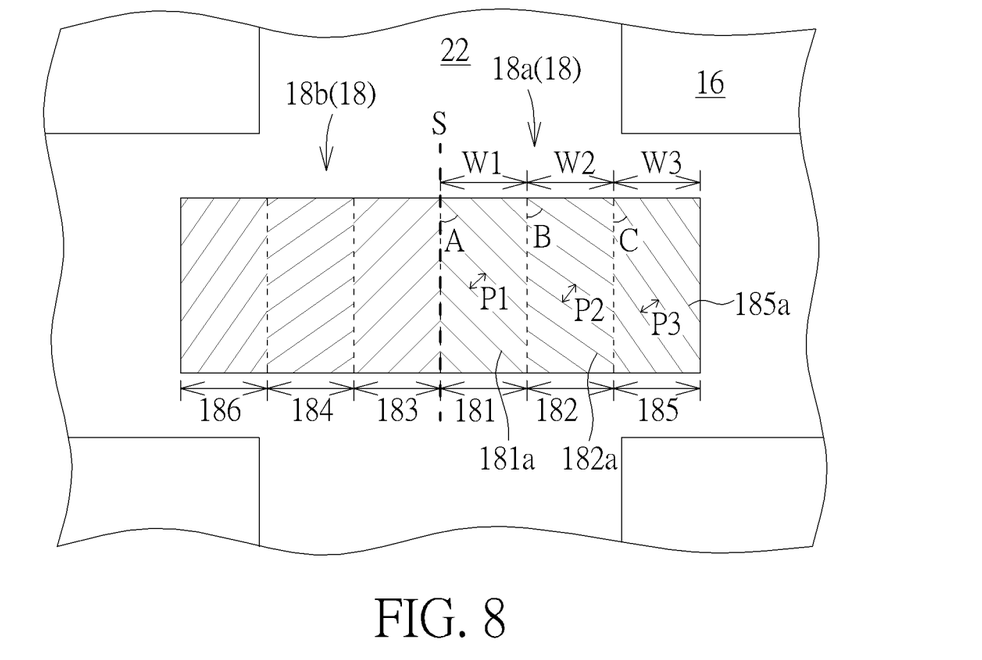
FIG. 8 depicts an alignment mark of an alignment system according another preferred embodiment of the present invention.
Figure 9:
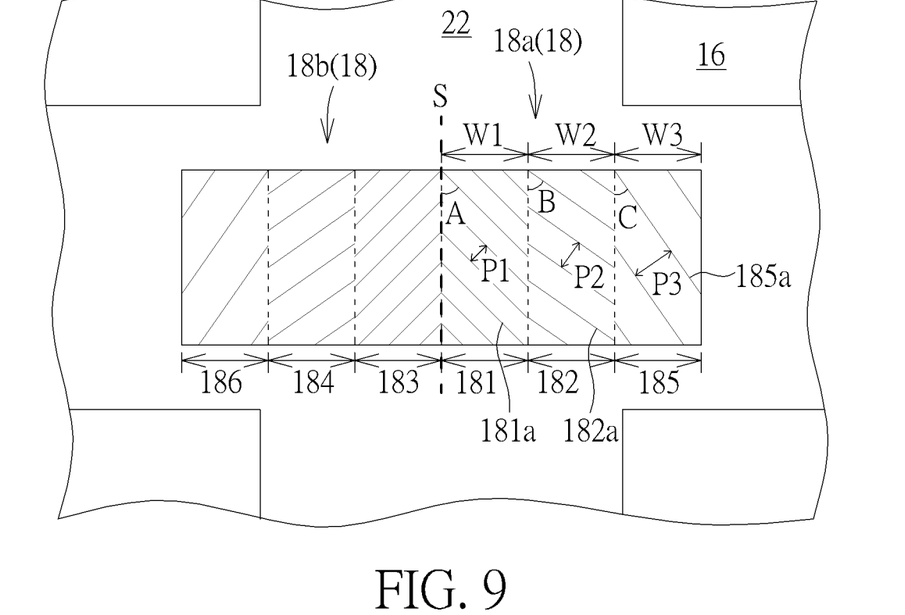
FIG. 9 depicts an alignment mark of an alignment system according another preferred embodiment of the present invention.

FIG. 7 to FIG. 9 depict an alignment mark of an alignment system of the present invention according other embodiments of the present invention, wherein elements in FIG. 7 to FIG. 9 which are substantially the same as those in the embodiment of FIG. 1 to FIG. 2 are denoted by the same reference numerals; an accompanying explanation is therefore omitted.

As shown in FIG. 7, an alignment mark 18 includes a first pattern 18a and a second pattern 18b disposed on the substrate 16. The first pattern 18a and the second pattern 18b are symmetrical. A symmetrical axis S is marked by dotted lines at an interface between the first pattern 18a and the second pattern 18b. The first pattern 18a includes a first region 181, a second region 182 and a fifth region 185. The second region 18b includes a third region 183, a fourth region 184 and a sixth region 186. The symmetrical axis S is set at the interface between the first region 181 and the third region 183 so that the first region 181 and the third region 183 are symmetrical with respective to the symmetrical axis S, the second region 182 and the fourth region 184 are symmetrical with respective to the symmetrical axis S and the fifth region 185 and the sixth region 186 are symmetrical with respective to the symmetrical axis S.

The first region 181 includes numerous first mark lines 181a parallel to each other. A first pitch P1 is disposed between the first mark lines 181a adjacent to each other. Each of the first mark lines 181a extends along a first direction. A first angle A is disposed between the first direction and the symmetrical axis S. The second region 182 includes numerous second mark lines 182a parallel to each other. A second pitch P2 is disposed between the second mark lines 182a adjacent to each other. Each of the second mark lines 182a extends along a second direction. A second angle B is disposed between the second direction and the symmetrical axis S. The fifth region 185 includes numerous third mark lines 185a parallel to each other. A third pitch P3 is disposed between the third mark lines 185a adjacent to each other. Each of the third mark lines 185a extends along a third direction. A third angle C is disposed between the third direction and the symmetrical axis S. Besides, the first region 181 includes a first width W1. The second region 182 includes a second width W2. The third region 185 includes a third width W3. The first width W1, the second width W2 and the third width are all perpendicular to the symmetrical axis S. Furthermore, a width of each of the first mark lines 181a are the same. A width of each of the second mark lines 182a are the same as well. A width of each of the third mark lines 185a are the same. The width of the first mark line 181a, the width of the second mark line 182a and the width of the third mark line 185a are also the same.

In the following description, a first angle A, the second angle B and the third angle C are the same as each other or different from each other means that degree of first angle A, degree of the second angle B and degree of the third angle are compared to show the similarity or difference. A first width W1, the second width W2 and the third width W3 are the same as each other or different from each other means that a value of the first width W1, a value of the second width W2 and a value of the third width W3 are compared to show the similarity or difference. A first pitch P1, the second pitch P2 and a third pitch P3 are the same as each other or different from each other means that a value of the first pitch P1, a value of the second pitch P2 and a value of the third pitch P3 are compared to show the similarity or difference.

The designing rules of the alignment mark 18 should at least obey one of the rules listed as follows. The designing rules include: (1) The first pitch P1, the second pitch P2 and the third pitch P3 are different from each other. (2) The first angle A, the second angle B and the third angle C are different from each other. (3) The first pitch P1, the second pitch P2 and the third pitch P3 are different from each other, and the first angle A, the second angle B and the third angle C are different from each other. When following the designing rules, the first width W1, the second width W2 and the third width W3 can be the same as each other or different from each other. According to a preferred embodiment of the present invention, the first angle A, the second angle B and the third angle C can be selected independently between 30 and 60 degrees. The second angle B is between 30 and 60 degrees. The first pitch P1, the second pitch P2 and the third pitch P3 can be selected independently between 0.6 and 1.8 μm. Please still refer to FIG. 7. The designing rule applied in FIG. 7 is that the first pitch P1 is smaller than the second pitch P2, the second pitch P2 is smaller than the third pitch P3 and the first angle A, the second angle B and the third angle C are the same. Under these designing rules, the first width W1, the second width W2 and the third width W3 are set to be the same. According to a preferred embodiment of the present invention, the first pitch P1 is between 0.6 and 1.0 μm, the second pitch P2 is between 1.0 and 1.4 μm and the third pitch is between 1.4 and 1.8 μm.

As shown in FIG. 8, the designing rule applied in FIG. 8 is that the first pitch P1, the second pitch P2 and the third pitch P3 are the same, the third angle C is smaller than the first angle A, and the first angle A is smaller than the second angle B. Under these designing rules, the first width W1, the second width W2 and the third width W3 are set to be the same. As shown in FIG. 9, the designing rule applied in FIG. 9 is that the first pitch P1 is smaller than the second pitch P2, the second pitch P2 is smaller than the third pitch P3, the third angle C is smaller than the first angle A, and the first angle A is smaller than the second angle B. Under these designing rules, the first width W1, the second width W2 and the third width W3 are set to be the same.

Figure 10:
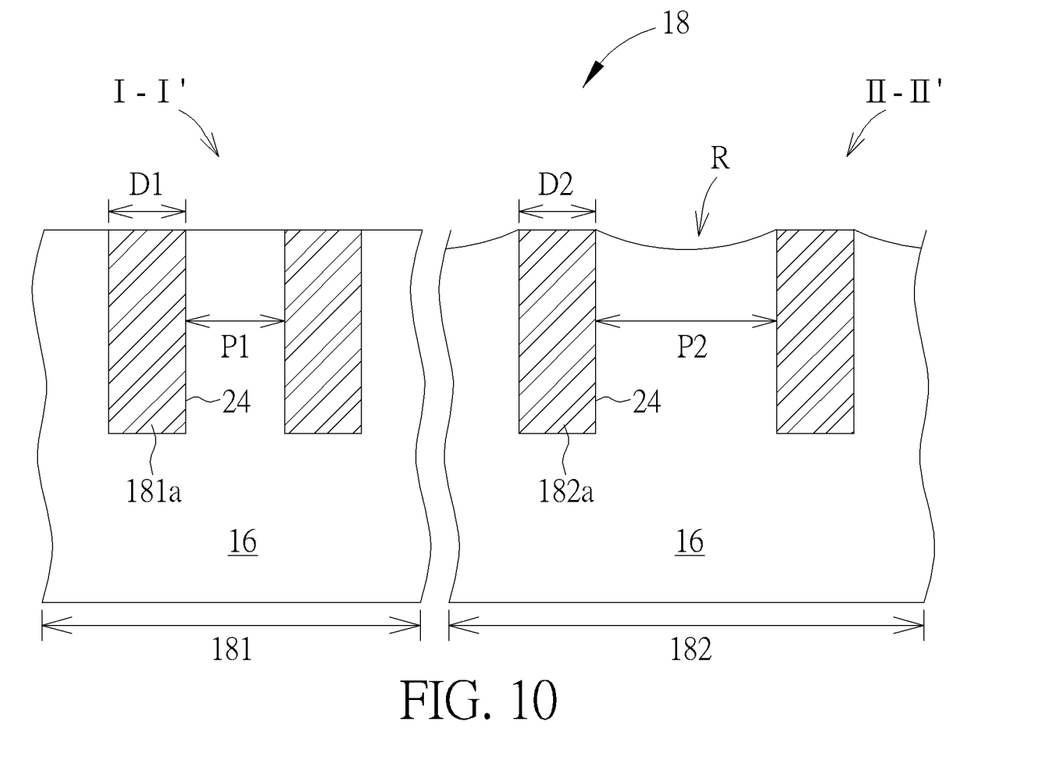
FIG. 10 schematically depicts magnified sectional views taken along line I-I' and line II-II' in FIG. 3.

FIG. 10 schematically depicts magnified sectional views taken along line I-I' and line II-II' in FIG. 3, wherein elements in FIG. 10 which are substantially the same as those in the embodiment of FIG. 3 are denoted by the same reference numerals; an accompanying explanation is therefore omitted. As shown in FIG. 10, the first mark lines 181a and the second mark lines 182a are embedded within the substrate 16. A width D1 of one of the first mark lines 181a is the same as a width D2 of one of the second mark lines 182a. The first pitch P1 is smaller than the second pitch P2. The manufacturing steps of the first mark lines 181a and the second mark lines 182a include forming numerous trenches 24 in the substrate 16, and trenches 24 are with the first pitch P1 and the second pitch set between the trenches 24. Later, a material layer such as a metal layer is formed to fill into each of the trenches 24 and cover a top surface of the substrate. Then, a planarization process such as a chemical mechanical planarization (CMP) is performed to remove the metal layer outside of the trenches 24 to form the first mark lines 181a and the second mark lines 182a. Because the second pitch P2 is larger than the first pitch P1, recesses Rare formed in the substrate 16 between the second mark lines 182a. The light source with the same wave length provided in the alignment system 18 radiates the mark lines and the substrate 16 between mark lines simultaneously. Then, the signal formed by the diffracted light from the mark lines and from the substrate 16 between the mark lines is analyzed. However, a signal with deviation is formed by the diffracted light from the second mark lines 182a, and the substrate 16 between the second mark lines 182a due to the recess R. On the other hand, because the first pitch P1 is smaller than the second pitch P2, the substrate 16 between the first mark lines 181a remains flat during the planarization process. Therefore, the alignment mark 18 in the first region 181 is a completed shape, and a signal formed by the diffracted light from the first mark lines 181a, and the substrate 16 between first mark lines 181a is accurate. Furthermore, because the first pitch P1 is smaller, due to the physical properties, the contrast intensity of the signal formed by the diffracted light from the first mark lines 181a, and the substrate 16 between first mark lines 181a often too weak for the sensor 20 (shown in FIG. 1) to detect and interpret correctly. As a result, the contrast intensity formed by the diffracted light from the pattern with a larger pitch (i.e., the pattern formed by the second mark lines 182a) is strong enough for the sensor 20 to interpret correctly, however there is deviation in the signal. On the other hand, the signal formed by the diffracted light from the pattern with a smaller pitch (i.e., the pattern formed by the first mark lines 181a) is accurate but not strong enough for the sensor 20 to interpret correctly. Therefore, two patterns are both used in the present invention. The mark lines with a larger pitch are used to locate the substrate 16 roughly followed by interpreting the accurate position of the substrate 16 by the mark lines with a smaller pitch.

As mentioned above, different light sources with different wave lengths radiate the alignment mark 18 by turns. When the mark lines with different pitches or angles are radiated by light sources with different wave lengths, diffracted lights respectively have different intensity are formed. For example, the intensity of the signal from the first mark lines 181a is strongest when the first mark lines 181a is radiated by green light (wave length 532 nm), and the intensity of the signal from the first mark lines 181a is weakest when the first mark lines 181a is radiated by red light (wave length 633 nm). The intensity of the signal from the third mark lines 185a is strongest when the third mark lines 185a is radiated by red light, and the intensity of the signal from the third mark lines 185a is weakest when the third mark lines 185a is radiated by green light. The intensity of the signal from the second mark lines 182a is strongest when the second mark lines 182a is radiated by light with wave length between 532 and 633 nm. After all light sources have radiate the alignment mark 18, signals with enough intensity can be provided by mark lines with a larger pitch and a smaller pitch, and signals can be received by the sensor 20. Furthermore, the intensity of the signal from the diffracted light is also influenced by the materials of the alignment mark 18. Therefore, which wave lengths can provide a better signal from the alignment mark may alter based on different design of the alignment mark and can be tested by a dummy wafer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An alignment system comprising:
   a first light source for emitting a first light;
   an alignment mark disposed on a substrate for receiving the first light, wherein the alignment mark comprises a first pattern and a second pattern disposed on the substrate, wherein the first pattern comprises a first region and a second region, the second pattern comprises a third region and a fourth region, a symmetrical axis is disposed at an interface between the first region and the third region, the first region and the third region are symmetrical with respective to the symmetrical axis, and the second region and the fourth region are symmetrical with respective to the symmetrical axis;
   wherein: the first region comprises a plurality of first mark lines parallel to each other, a first pitch is disposed between the plurality of first mark lines adjacent to each other, the second region comprises a plurality of second mark lines parallel to each other, a second pitch is disposed between the plurality of second mark lines adjacent to each other, and the first pitch is different from the second pitch, and wherein the second region, the first region, the third region and the fourth region are lined up; and
   a sensor used for detecting a first diffracted light diffracted from the alignment mark radiated by the first light.

2. The alignment system of claim 1, wherein the first pattern further comprises a fifth region, the second pattern further comprises a sixth region, the fifth region and the sixth region are symmetrical with respective to the symmetrical axis, the fifth region comprises a plurality of third mark lines parallel to each other, a third pitch is disposed between the plurality of third mark lines adjacent to each other, and a value of the first pitch, a value of the second pitch is different from a value the third pitch.

3. The alignment system of claim 2, wherein each of the plurality of first mark lines extends along a first direction, a first angle is disposed between the first direction and the symmetrical axis, each of the plurality of second mark lines extends along a second direction, a second angle is disposed between the second direction and the symmetrical axis, each of the plurality of third mark lines extends along a third direction, a third angle is disposed between the third direction and the symmetrical axis, and a degree of the first angle, a degree of the second angle and a degree of the third angle are different from each other.

4. The alignment system of claim 1, wherein each of the plurality of first mark lines extends along a first direction, a first angle is disposed between the first direction and the symmetrical axis, each of the plurality of second mark lines extends along a second direction, a second angle is disposed between the second direction and the symmetrical axis, and a degree of the first angle is different from a degree of the second angle.

5. The alignment system of claim 4, wherein the first angle is between 30 and 60 degrees, and the second angle is between 30 and 60 degrees.

6. The alignment system of claim 1, wherein each of the plurality of first mark lines extends along a first direction, a first angle is disposed between the first direction and the symmetrical axis, each of the plurality of second mark lines extends along a second direction, a second angle is disposed between the second direction and the symmetrical axis, and a degree of the first angle and a degree of the second angle are the same.

7. The alignment system of claim 6, wherein the first angle is between 30 and 60 degrees.

8. The alignment system of claim 1, wherein the first region has a first width perpendicular to the symmetrical axis, the second region has a second width perpendicular to the symmetrical axis, and a value of the first width and a value of the second width are the same.

9. The alignment system of claim 1, wherein the first region has a first width perpendicular to the symmetrical axis, the second region has a second width perpendicular to the symmetrical axis, and a value of the first width is different from a value of the second width.

10. The alignment system of claim 1, further comprising a second source for emitting a second light to illuminate the alignment mark, wherein a wavelength of the first light source is different from a wavelength of the second light source, and the sensor is used for detecting a second diffracted light diffracted the second light from the alignment mark.

11. The alignment system of claim 1, wherein the first region is nearer the symmetrical axis, and the second region is farther from the symmetrical axis.

12. An alignment system, comprising:
a first light source for emitting a first light;
an alignment mark disposed on a substrate for receiving the first light, wherein the alignment mark comprises a first pattern and a second pattern disposed on the substrate, wherein the first pattern comprises a first region and a second region, the second pattern comprises a third region and a fourth region, a symmetrical axis is disposed at an interface between the first region and the third region, the first region and the third region are symmetrical with respect to the symmetrical axis, and the second region and the fourth region are symmetrical with respect to the symmetrical axis;
wherein: the first region comprises a plurality of first mark lines parallel to each other, each of the plurality of first mark lines extends along a first direction, a first angle is disposed between the first direction and the symmetrical axis, the second region comprises a plurality of second mark lines parallel to each other, each of the plurality of second mark lines extends along a second direction, a second angle is disposed between the second direction and the symmetrical axis, the first angle is different from the second angle, and wherein the second region, the first region, the third region and the fourth region are lined up; and
a sensor used for detecting a first diffracted light diffracted from the alignment mark radiated by the first light.

13. The alignment system of claim 12, wherein the first pattern further comprises a fifth region, the second pattern further comprises a sixth region, the fifth region and the sixth region are symmetrical with respective to the symmetrical axis, the fifth region comprises a plurality of third mark lines parallel to each other, each of the plurality of third mark lines extends along a third direction, a third angle is disposed between the third direction and the symmetrical axis, a degree of the first angle, a degree of the second angle, and a degree of the third angle are different from each other.

14. The alignment system of claim 13, wherein a first pitch is disposed between the plurality of first mark lines adjacent to each other, a second pitch is disposed between the plurality of second mark lines adjacent to each other, a third pitch is disposed between the plurality of third mark lines adjacent to each other, and a value of the first pitch, a value of the second pitch and a value the third pitch are different from each other.

15. The alignment system of claim 12, wherein a first pitch is disposed between the plurality of first mark lines adjacent to each other, a second pitch is disposed between the plurality of second mark lines adjacent to each other, and a value of the first pitch is different from a value of the second pitch.

16. The alignment system of claim 12, wherein a first pitch is disposed between the plurality of first mark lines adjacent to each other, a second pitch is disposed between the plurality of second mark lines adjacent to each other, and a value of the first pitch and a value of the second pitch are the same.

17. The alignment system of claim 12, wherein the first region has a first width perpendicular to the symmetrical axis, the second region has a second width perpendicular to the symmetrical axis, and a value of the first width and a value of the second width are the same.

18. The alignment system of claim 12, wherein the first region has a first width perpendicular to the symmetrical axis, the second region has a second width perpendicular to the symmetrical axis, and a value of the first width is different from a value of the second width.

19. The alignment system of claim 12, further comprising a second source for emitting a second light to illuminate the alignment mark, wherein a wavelength of the first light source is different from a wavelength of the second light source, and the sensor is used for detecting a second diffracted light diffracted the second light from the alignment mark.

20. The alignment system of claim 12, wherein the first angle is between 30 and 60 degrees, and the second angle is between 30 and 60 degrees.

* * * * *